United States Patent [19]

Smither

[11] Patent Number: 4,704,584

[45] Date of Patent: Nov. 3, 1987

[54] INSTANTANEOUS FLOATING POINT AMPLIFIER

[75] Inventor: Miles A. Smither, Houston, Tex.

[73] Assignee: Fairfield Industries, Houston, Tex.

[21] Appl. No.: 878,188

[22] Filed: Jun. 25, 1986

[51] Int. Cl.$^4$ .............................................. H03G 3/30
[52] U.S. Cl. ..................................... 330/86; 330/282
[58] Field of Search ................... 330/9, 86, 278, 279, 330/282; 367/21, 22, 38

[56] References Cited

U.S. PATENT DOCUMENTS

| | | | |
|---|---|---|---|
| 3,241,100 | 3/1966 | Loofbourrow | 340/15.5 |
| 3,264,574 | 8/1966 | Loofbourrow | 330/51 |
| 3,308,392 | 3/1967 | McCarter | 330/144 |
| 3,671,931 | 6/1972 | Loofbourrow | 340/15.5 |
| 3,699,325 | 10/1972 | Montgomery, Jr. | 235/154 |
| 3,819,864 | 6/1974 | Carroll et al. | 179/15 |
| 3,891,836 | 6/1975 | Lee | 235/151.12 |
| 3,947,806 | 3/1976 | Corkhill et al. | 340/15.5 |
| 3,958,213 | 5/1976 | Scott et al. | 340/261 |
| 4,031,504 | 6/1977 | Mioduski | 340/15.5 |
| 4,104,596 | 8/1978 | Smither | 330/9 |
| 4,158,819 | 6/1979 | Smither | 330/9 |
| 4,194,163 | 3/1980 | Gillespie | 330/86 |
| 4,210,968 | 7/1980 | Lindseth | 367/46 |
| 4,240,070 | 12/1980 | Helbig et al. | 340/347 |
| 4,276,620 | 6/1981 | Kahn et al. | 367/60 |
| 4,309,763 | 1/1982 | Passmore et al. | 367/3 |
| 4,357,577 | 11/1982 | Smither | 330/51 |
| 4,554,511 | 11/1985 | Braun | 330/9 |
| 4,628,276 | 12/1986 | Mizutani | 330/86 |

*Primary Examiner*—Eugene R. LaRoche
*Assistant Examiner*—Steven J. Mottola
*Attorney, Agent, or Firm*—Vaden, Eickenroht, Thompson & Boulware

[57] ABSTRACT

An improved instantaneous floating point (IFP) amplifier is provided having a plurality of cascaded amplifier stages, with each stage having a plurality of possible gains. The input sample signal is passed through each stage so that no stage is selectively bypassed.

A bipolar, logarithmic amplifier is used for gain control. The gain control bits correspond to the industry standard gain control codes, thereby eliminating the need for bit mapping.

The offset voltage control circuit is initialized during power-up by removing the IFP input signal and measuring the input referred offset at each gain setting. The measurements are stored. When a sample signal is received at the IFP amplifier input, the appropriate gain is applied to that signal along with the stored offset value corresponding to that gain.

7 Claims, 5 Drawing Figures

INSTANTANEOUS FLOATING POINT AMPLIFIER

BACKGROUND OF THE INVENTION

1. Field of the Invention

This invention relates to instantaneous floating point (IFP) amplifiers which amplify a fluctuating input signal to a level within preselected limits.

2. Description of the Prior Art

In seismic exploration, sound waves are commonly used to probe the earth's crust as a means of determining the types and location of subsurface formations. The earth's crust can be considered a transmission medium or filter whose characteristics are to be determined by passing sound waves through that medium. In the reflection seismic method, sound waves or impulses are generated at a transmission point at or near the earth's surface, and sound waves reflected from subsurface reflecting boundaries are received at one or more receiving points. The received waves are detected by seismic detectors, e.g., geophones, which generate electrical signals at their outputs. Information relating to subsurface formations is contained in these signals, and they are recorded in a form which permits analysis. Skilled interpreters can discern from the analysis the shape and depth of subsurface reflection boundaries and the likelihood of finding an accumulation of minerals, such as oil and gas.

In a typical seismic field recording system, the seismic detectors are arranged in arrays or nests. The outputs of these arrays are time-division multiplexed, amplified, digitized, and recorded. In a typical time-division multiplexed system, the output of each array is sampled one per sample time, and it is common for the sample time to be either one millisecond, two milliseconds, or four milliseconds.

The amplification of the output of a seismic detector array is complicated in that the amplitude of the input sound waves is a function of time. Additionally, the amplitude of the reflected sound waves decreases with time, because recording is typically continued after the generation of input sound waves is terminated. Accordingly, it is undesirable in seismic operations to utilize an amplifier having a fixed gain.

The amplifier which has commonly been utilized to amplify the output of a seismic array is known as an instantaneous floating point amplifier. The gain of this type of amplifier varies depending upon the magnitude of the input signal, and the amplifier is usually designed to apply a gain to this input such that the amplifier output, when sampled, is at a level within preselected limits. Typically, the amplifier is designed to amplify the input signal to a level between one-half and the full scale output of the amplifier.

A typical instantaneous floating point amplifier includes a plurality of cascaded amplifier stages, and the number of stages and the gain of each stage determine the maximum gain that the amplifier can apply to the signal presented at its input. A given stage of the amplifier may be used or may be selectively bypassed, depending upon the amount of gain that must be applied to the input signal to amplify it within the preselected limits.

A typical instantaneous floating point amplifier also includes control circuitry which determines, for each input signal, those stages of amplification which are required to amplify the input signal to within the preselected limits, and which stages are to be selectively bypassed. This control circuitry typically generates a gain word which is representative of which stages of the amplifier are presently being utilized to amplify the input signal. Of course, as the number of stages of amplification in the amplifier increases in an amplifier using this selective bypassing approach, the generation of the gain word becomes more complex. It is, therefore, desirable to minimize the number of stages of amplification which are required to implement a given amplifier by using an approach other than the selective bypassing of stages.

Another problem with prior art IFP amplifiers using the selective bypassing approach is that the higher gain stages almost always go to saturation. This necessitates a longer interval for the operational amplifiers in those stages to settle before the next sample signal is received, and it also complicates offset voltage control since the offset voltages of the IFP's operational amplifiers change when they are saturated. Therefore, it is desirable to provide for an IFP amplifier whose stages do not become saturated.

Instantaneous floating point amplifiers, like amplifiers in general, have inherent offset voltages which are amplified together with the input signals. Since it is imperative that the ultimately recorded data be as uncorrupted by noise as possible, this amplified offset voltage must be removed before later processing begins. This technique of removing the offset voltage has commonly been referred to as "nulling the amplifier".

Prior art amplifier systems typically correct the offset voltages of the system's operation amplifiers on a component-by-component basis, or use a nulling technique which disables the amplifier for offset correction while data is being received. Component-by-component offset correction requires a great deal of hardware and complex circuitry while the latter, disabling technique results in a loss of valuable data. Therefore, it is desirable to achieve offset voltage correction using less hardware without any loss of valuable data.

Gain control in prior art IFP amplifiers is achieved in several ways. A typical prior art device achieves gain control by first measuring the sample signal and applying a low gain to the sample signal which is of such a magnitude that the IFP amplifier cannot go into saturation. The resulting signal is again measured, and a higher gain is then applied, again so that the applied gain will not cause the IFP amplifier to go into saturation. This process is repeated until the appropriate gain is finally determined.

It is apparent that the above process is very time-consuming and requires that a lot of measurements be taken for each sample. Thus, it is desirable to achieve gain control by taking a single measurement and applying the appropriate gain in a single step. The use of a bipolar logarithmic amplifier like that in the present invention accomplishes this result.

The instantaneous floating point amplifier of the present invention overcomes these and other shortcomings of the prior art in the manner described below.

SUMMARY OF THE INVENTION

An improved instantaneous floating point (IFP) amplifier is provided having a plurality of cascaded amplifier stages, with each stage having a plurality of possible gains. The IFP amplifier input sample signal is passed through each stage so that no stage is selectively bypassed. This approach requires fewer stages and less hardware than the selective bypassing approach used in the prior art. Nevertheless, no operational amplifier in any stage goes to saturation, thereby eliminating the longer settling times needed when amplifiers saturate.

In a preferred embodiment, the IFP amplifier has two cascaded stages, each of which has four gains. The low gain stage has gains of 1, 2, 4 and 8, while the gains of the high gain stage are 1, 16, 256, and 4096.

The IFP input signal is applied to a bipolar logarithmic amplifier, which is used to set the appropriate gain. The output of the logarithmic amplifier is converted into an eight-bit representation of the sample IFP input signal. This eight-bit code in turn is used by a processor to recover the optimum four-bit gain code from a lookup table. The gain code corresponds to the industry standard gain control codes, thereby eliminating the need for bit mapping. This process is performed with the IFP gain set at unity to prevent saturation of any operational amplifier. The gain code is then applied to the IFP amplifier by means of four control lines.

Offset voltage control in the IFP amplifier is achieved in a unique manner that requires fewer hardware components and without loss of any valuable data. The offset control circuit is initialized during the amplifier's power-up sequence by removing the IFP input signal and measuring the total input referred IFP offset at each gain setting of the IFP amplifier. The resulting measurements are stored. When a sample signal is received at the IFP amplifier input, the appropriate gain is applied to that input signal along with the stored offset correction value corresponding to that gain. The offset correction values are continuously adjusted during the operation of the IFP amplifier.

It is a feature of the present invention that the input signal passes through all gain stages without bypassing any stages and yet no operational amplifier goes to saturation.

It is another feature of the present invention to utilize the logarithmic relationship between the input sample signals and the gain codes to achieve gain control.

It is yet another feature of the present invention to measure the total offset voltage of the IFP amplifier at each gain setting, store it, and apply the appropriate offset correction voltage to the input of the IFP amplifier when a sample signal is received.

It is yet another feature of the present invention to set a one-to-one correspondence between the gain control bits and the industry standard four-bit gain control codes, thereby eliminating the need for bit mapping.

These and other features of the invention will be apparent to one skilled in the art from the drawings and the detailed description.

DETAILED DESCRIPTION

Figure 1:
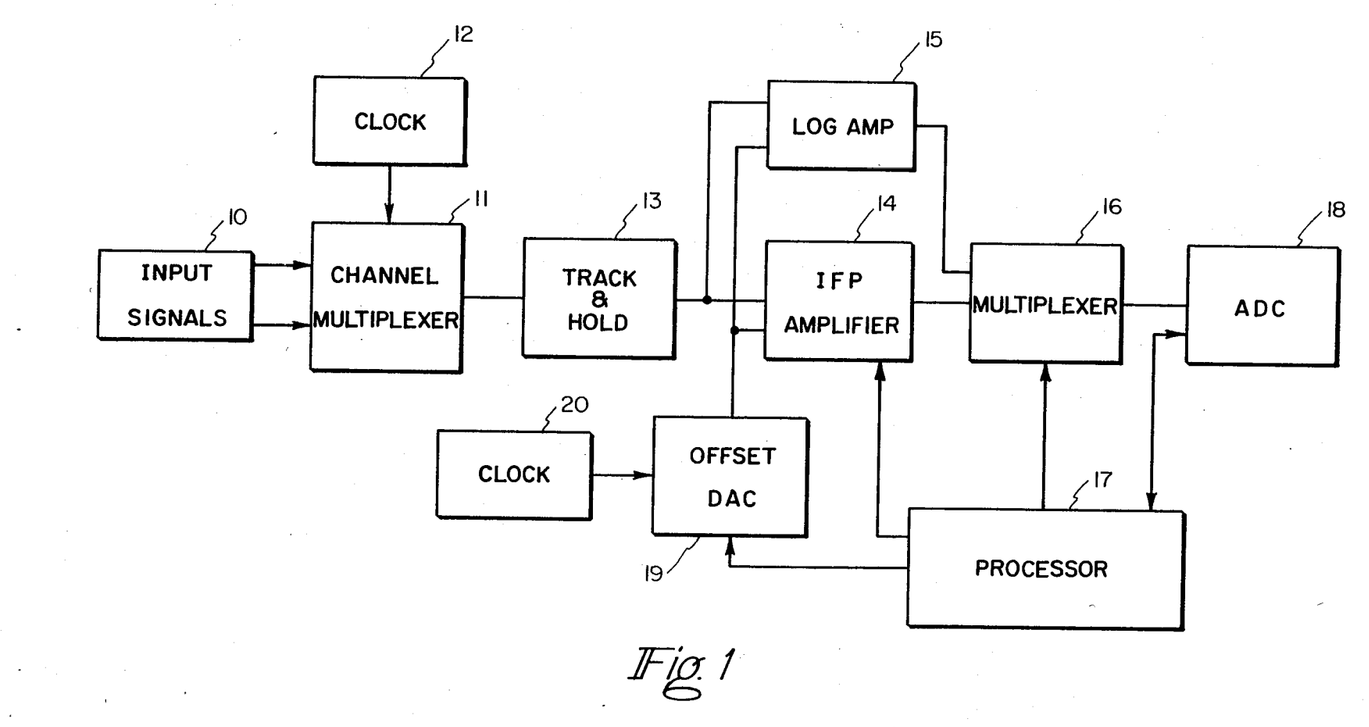
FIG. 1 is a block diagram of the instantaneous floating point amplifier and the control circuitry relating thereto.

Referring to FIG. 1, the input sample signals from one or more channels are sent via input 10 to channel multiplexer 11. In response to clock 12, channel multiplexer 11 sends the input sample signals one at a time to track and hold 13, which holds the sample and applies it both to the input of IFP amplifier 14 and to bipolar logarithmic amplifier 15. The output of logarithmic amplifier 15, which is logarithmically related to the input sample signal, is sent to multiplexer 16. In response to clock signals from processor 17, multiplexer 16 sends the logarithmic signals from the output of logarithmic amplifier 15 to an eight-bit analog to digital converter (ADC) 18, wherein they are digitized and sent to processor 17. Processor 17 then determines the appropriate gain from a look-up table internal to it, and sends the four corresponding gain control bits to the input of IFP amplifier 14, where they are applied to the input sample signals.

From another look-up table, processor 17 also determines the offset correction voltage corresponding to the gain to be applied to each input sample signal, and sends the digital offset correction value to digital to analog converter (DAC) 19. In response to a signal from clock 20, offset DAC 19 applies the analog offset signal to the input of IFP amplifier 14.

To keep IFP amplifier 14 out of saturation at all times, the gain and offset correction must be applied at the appropriate times. If the gain is to be increased, the new offset correction is applied before the new gain. If the gain is to be decreased, the new gain should be applied before the new offset.

Before IFP amplifier 14 is put into operation, the offset voltages of the device's operational amplifiers must be determined, and the offset correction circuit initialized, so that the sample input signals may subsequently be corrected to eliminate the offset voltages. Unless such gain related offset voltages are removed, the IFP amplifier may go into saturation or undesirable harmonic distortion will be present in IFP amplifier's output signal.

The offset circuit is initialized during the IFP amplifier's power-up sequence by removing the input signal and measuring the total input-referred IFP amplifier offset at each gain setting of IFP amplifier 14. The resulting measurements are stored in processor 17 for application to the input sample signal with the appropriate gain for that signal.

The offset correction voltages are continuously adjusted during operation of the IFP amplifier in one of several ways which are well known to those skilled in the art. This updating of the offset voltages is desirable to take into account the changes in the components' offsets caused by temperature variations in the IFP amplifier over time.

Figure 2:
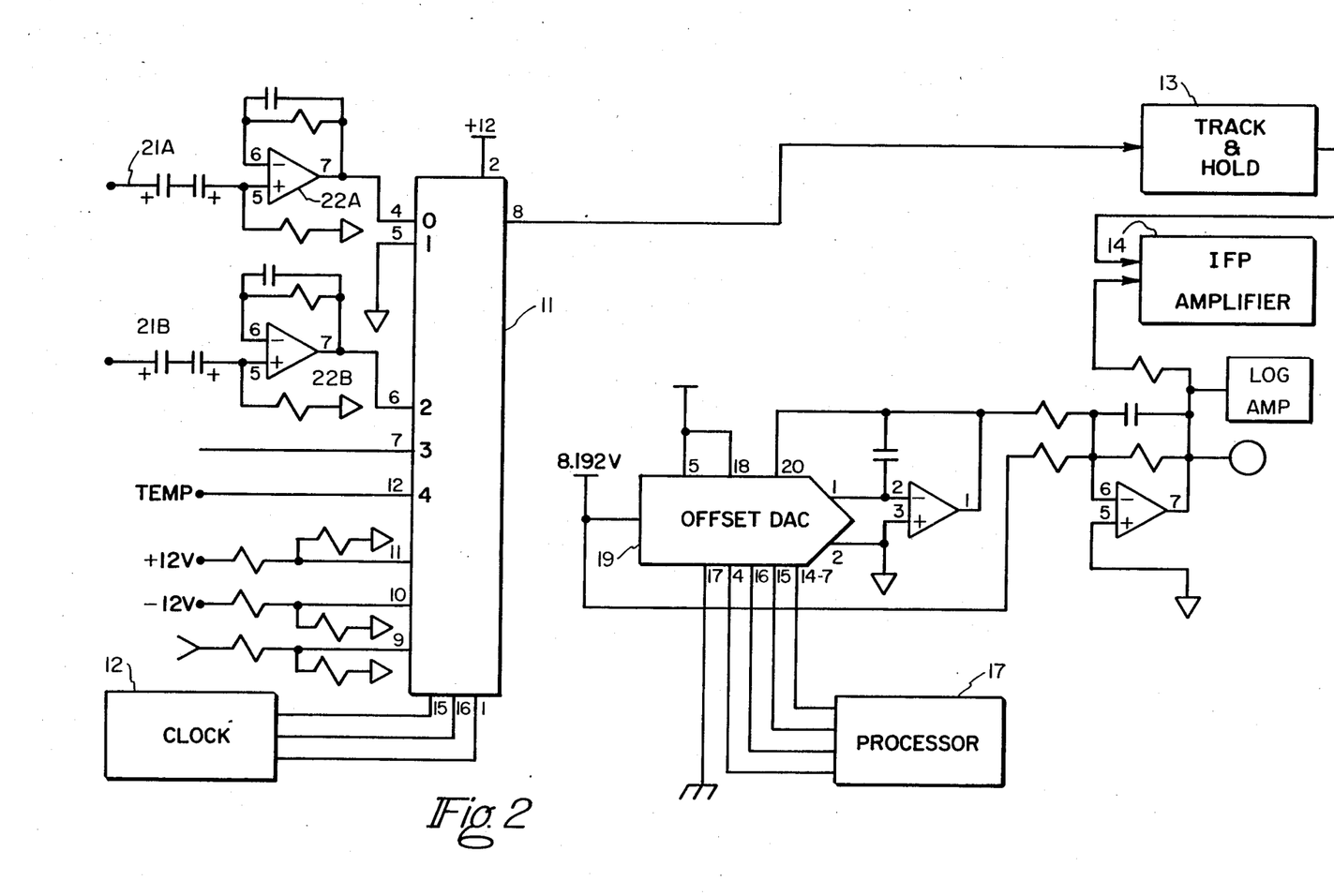
FIG. 2 is a schematic diagram of the offset correction circuitry used in the present invention.

Referring now to FIG. 2, the offset correction circuit is initialized in the following manner. A sample input signal is input to channel multiplexer 11 via either channel 21A or 21B. Channel multiplexer 11 is a one-to-eight multiplexer. Assuming channel 21A is used, the signal is input to channel multiplexer 11 at pin 0. In response to a signal from clock 12, the channel 21A signal is sent via pin 8 to both track and hold 13 and to IFP amplifier 14.

The gain of IFP amplifier 14 is set at one of its gain values, i.e., at unity. The gain related offset voltage of IFP amplifier 14 is then measured. Processor 17 then sequentially sends the possible digital values for the offset correction from its look-up table to offset DAC 19. Offset DAC 19 converts those digital values to analog ones, and sequentially compares them with the measured offset voltage at the chosen gain until a match is found, i.e., until the output of IFP amplifier 14 is zero at the chosen gain. The appropriate offset correction voltage for the chosen gain is then stored in processor 17.

The offset voltages of operational amplifiers 22A and 22B are similarly measured and stored for the chosen gain, and the process is repeated for channel 21B at the chosen gain setting.

The above sequence is repeated for each other gain setting of IFP amplifier 14, and the offset correction voltages are stored in processor 17.

In a preferred embodiment, offset DAC 19 has an output range of about −8 volts to +8 volts. Since offset correction is applied through a one thousand-to-one resistor voltage divider, gain-related IFP offsets up to +/−8 millivolts can be corrected. This 16 millivolt range is resolved into 4096 steps when a 12 bit offset DAC 19 used. Therefore, the gain related IFP offset can be corrected to within +/−2 uV.

As stated above, the offset correction voltages may be continuously adjusted in one of several ways. One such method is as follows. An input sample signal is processed through IFP amplifier 14 and is converted to an eight-bit digital word. Its polarity is determined by comparing it with the ground reference, pin 1 of channel multiplexer 11. The digital offset correction voltage for the gain corresponding to that sample is adjusted, up or down, by one least significant bit (LSB) in the direction opposite to the measure polarity of the sample. This process is then repeated for the next sample.

Another method for continuously adjusting the offset voltages is similar to that discussed above except that a ground reference is not used to determine the polarity of the sample. In this method, the polarity of the processed sample itself is used to adjust the stored offset, up or down, by one LSB. As with the other method, the direction of the adjustment is opposite to the polarity of the processed sample; this is, if the sample's polarity is positive, the corresponding offset correction voltage is adjusted downward by one LSB.

Figure 3:
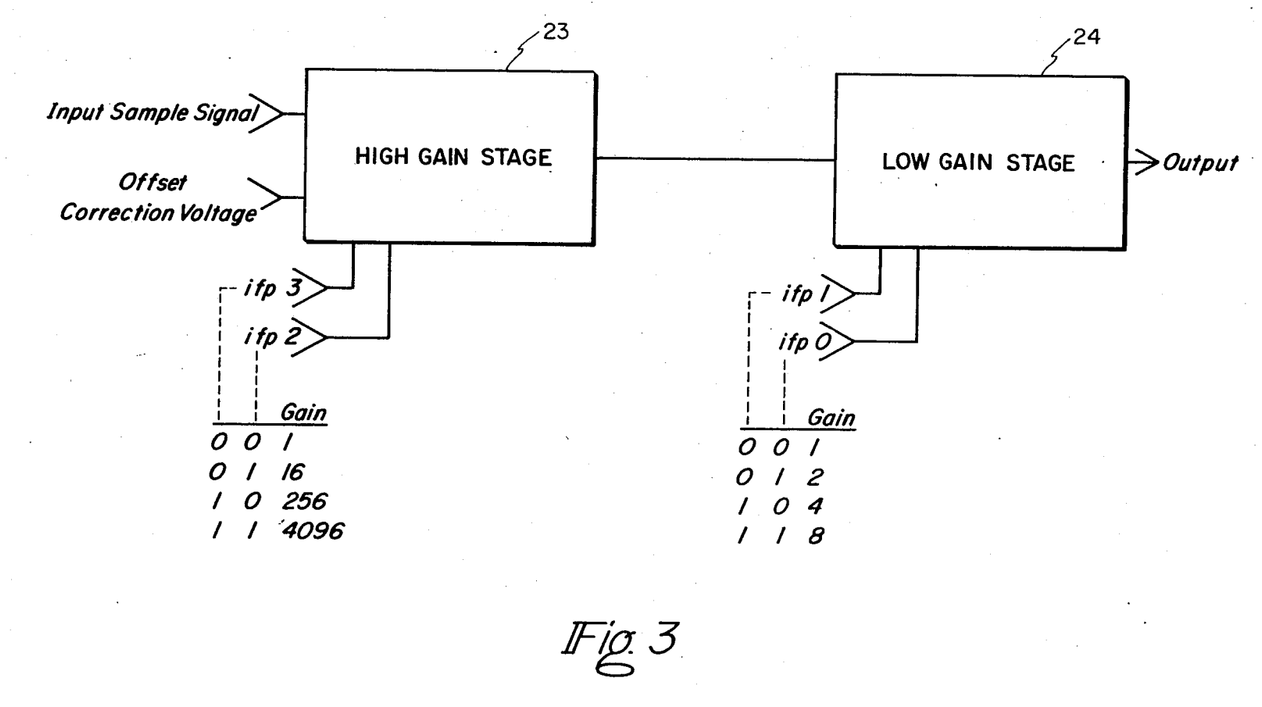
FIG. 3 is a block diagram of the instantaneous floating point amplifier of the present invention.

Once the offset correction circuit has been initialized, IFP amplifier 14 is ready to accept sample data. As shown by FIG. 3, IFP amplifier 14 may be comprised of two cascaded stages 23 and 24, each stage having four possible gains. Of course, both the number of stages and the number of gain settings may be varied and still be within the scope of the present invention.

High gain stage 23 has gain settings of 1, 16, 256, and 4096, while low gain stage 24 has settings of 1, 2, 4, and 8. Both the input sample signal and the offset correction voltage are applied to the input of high gain stage 23, as are two high gain control bits via control lines ifp3 and ifp2, obtained from a look-up table in the memory of processor 17. The output of high gain stage 23 is always input to low gain stage 24; that is, stage 24 is never bypassed. Two low gain control bits are applied via control lines ifp0 and ifp1 to low gain stage 24 from a look-up table located in the memory of processor 17.

Although FIG. 3 depicts the high gain stage as preceding the low gain stage, the order of the stages is of no consequence and may be reversed.

Figure 4:
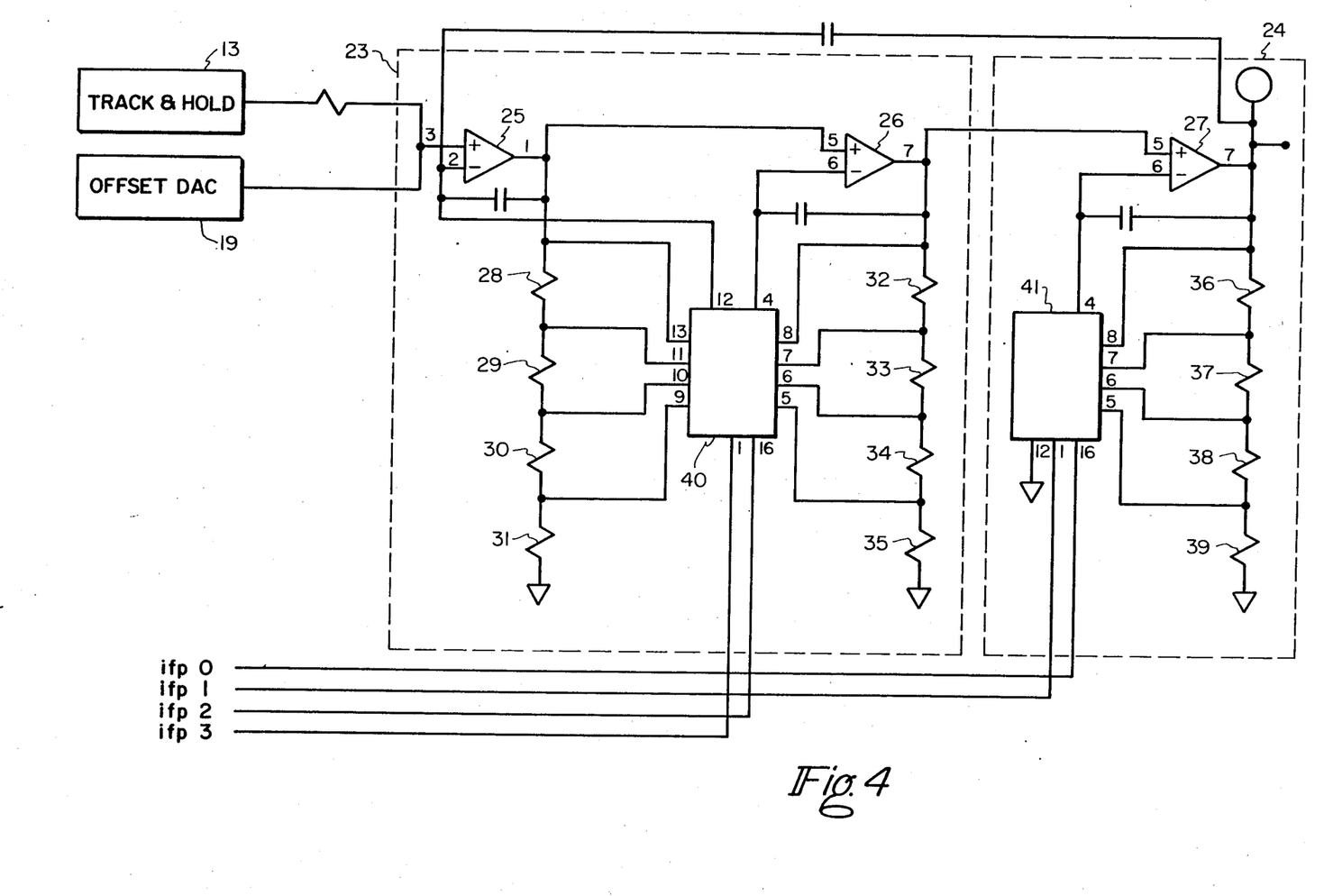
FIG. 4 is a schematic circuit diagram of the instantaneous floating point amplifier.

IFP amplifier 14 will now be discussed in greater detail in reference to FIG. 4. In FIG. 4, high gain stage 23 has two cascaded operational amplifiers 25 and 26. Each of operational amplifiers 25 and 26 realizes the square root of the total gain of stage 23. Since high gain stage 23 realizes gains of 1, 16, 256, and 4096, operational amplifiers 25 and 26 may each realize a gain of 1, 4, 16 and 64. These realized gains were selected to reduce the required operational amplifier gain bandwidth product for a given gain accuracy and settling time. The largest closed loop gain obtained from any single operational amplifier in IFP amplifier 14 is 64. Thus, if a gain accuracy of 0.01% is required, an operational amplifier with an open loop gain of 640,000 will be needed.

Low gain stage 24 uses a single operational amplifier 27, which realizes gains of 1, 2, 4 and 8. To realize the maximum gain of 8 for operational amplifier 27 to a gain accuracy of 0.01% will require an operational amplifier with an open loop gain above 80,000.

The gains in each stage are set by precision resistors 28 through 39. The accuracy of these gains is maintained by the IFP circuit topology. Both stages use non-inverting amplifiers which give a slight noise advantage over inverting amplifiers. This also permits the gains to be set independently of gain setting multiplexers 40 and 41. In particular, it is observed that the "on" resistances of gain setting multiplexers 40 and 41, for stages 23 and 24 respectively, are not factors in determining any stage gain since these resistances are in series with the inputs of operational amplifiers 25, 26 and 27.

IFP amplifier 14 is controlled by four control lines, ifp0, ifp1, ifp2, and ifp3. The IFP's gain control bits are chosen so that they have a one-to-one correspondence with the industry standard, four-bit gain control code. The control line versus gain mapping is set forth in Table 1:

TABLE 1

| ifp 3 | ifp 2 | ifp 1 | ifp 0 | Gain |
|---|---|---|---|---|
| 0 | 0 | 0 | 0 | $2^0 = 1$ |
| 0 | 0 | 0 | 1 | $2^1 = 2$ |
| 0 | 0 | 1 | 0 | $2^2 = 4$ |
| 0 | 0 | 1 | 1 | $2^3 = 8$ |
| 0 | 1 | 0 | 0 | $2^4 = 16$ |
| 0 | 1 | 0 | 1 | $2^5 = 32$ |
| 0 | 1 | 1 | 0 | $2^6 = 64$ |
| 0 | 1 | 1 | 1 | $2^7 = 128$ |
| 1 | 0 | 0 | 0 | $2^8 = 256$ |
| 1 | 0 | 0 | 1 | $2^9 = 512$ |
| 1 | 0 | 1 | 0 | $2^{10} = 1024$ |
| 1 | 0 | 1 | 1 | $2^{11} = 2048$ |
| 1 | 1 | 0 | 0 | $2^{12} = 4096$ |
| 1 | 1 | 0 | 1 | $2^{13} = 8192$ |
| 1 | 1 | 1 | 0 | $2^{14} = 16,384$ |
| 1 | 1 | 1 | 1 | $2^{15} = 32,768$ |

The operation of IFP amplifier 14 will now be described using a typical example. Assume processor 17 has determined that the appropriate gain control code for the input signal is 0100. Thus, control line ifp3 inputs a 0 to pin 1 of gain setting multiplexer 40, line ifp2 inputs a 1 to pin 16 of multiplexer 40, line ifp1 inputs a 0 to pin 1 of gain setting multiplexer 41, and line ifp0 inputs a 0 to pin 16 of multiplexer 41.

Multiplexer 40 then connects pin 11 to pin 12 and pin 4 to pin 7. This provides a feedback path to operational amplifier 25 which results in a gain of 4 from the input of operational amplifier 25 to its output.

The output of operational amplifier 25 becomes the input of operational amplifier 26. Since pin 4 is connected to pin 7 in multiplexer 40, the feedback path to operational amplifier 26 also results in a gain of 4.

Therefore, the total gain of high gain stage 23 is 4×4=16.

Regarding low gain stage 24, the presence of zeros on pins 1 and 16 of gain setting multiplexer 41 causes multiplexer 41 to connect its pins 4 and 8. This results in a gain of 1. Thus, the total gain applied to the input signal in the example is 4×4×1=16. It is observed that 16=2⁴, which corresponds to the value of the industry gain control code and the four-bit binary representation of the base ten number, 16. See Table 1.

As stated above, the present invention uses a bipolar logarithmic amplifier 15 (FIG. 1) to achieve gain control. A logarithmic amplifier is used since the ranges of input sample signals bear a logarithmic relationship to the IFP gain control codes.

For example, assume that the absolute value of a normalized input sample signal ranges between 0.0 and +1.0. Let n be a value near full scale, such as 0.75. The following table indicates the input magnitude ranges versus the ideal gain control settings:

TABLE 2

| Range of Input Signals | IFP Gain Control Codes |
| --- | --- |
| $0.0 - n/(2^{15})$ | 1111 |
| $n/(2^{15}) - n/(2^{14})$ | 1110 |
| $n/(2^{14}) - n/2^{13})$ | 1101 |
| ... | ... |
| $n/(2^3) - n/(2^2)$ | 0010 |
| $n/(2^2) - n/2^1)$ | 0001 |
| $n/(2^1) - 1.0$ | 0000 |

It is apparent from Table 2 that the ranges of input signals bear a logarithmic relationship to the IFP amplifier's gain control codes, thereby enabling a logarithmic amplifier to be used to rapidly determine the optimum IFP gain control code.

The IFP input signal is applied to a bipolar logarithmic amplifier 15, the output of which is used to set the gain. In a preferred embodiment, the output of logarithmic amplifier 15 is converted to an eight-bit word by analog to digital converter 18 (FIG. 1), which in turn is used by processor 17 to recover the optimum the gain from a look-up table. This process is performed with the gain of IFP amplifier 14 set to unity to prevent saturation of IFP amplifier 14. After the optimum gain for the present sample is determined, the appropriate IFP offset correction voltage and gain are applied to the input of IFP amplifier 14 as discussed above.

In a preferred embodiment, the input-output response of logarithmic amplifier 15 is defined by the following equation:

EQUATION 1

$$e_{out} = \text{sgn}(e_{in}) \times 0.5434 \times \ln(7.941E^{03} \times |e_{in}|)$$

where
$e_{out}$ is the output signal of logarithmic amplifier 15
$e_{in}$ is the input signal to logarithmic amplifier 15
sgn ($e_{in}$) is the sign of the input signal $e_{in}$
$|e_{in}|$ is the absolute value of the input signal $e_{in}$ For example, assume that the range of the input signal $e_{in}$ is between +/−8.192 volts, and let n=0.75. Then the decision points on this input signal range, the corresponding logarithmic amplifier 15 output values $e_{out}$, and the eight-bit results of the conversion by analog to digital converter (ADC) 18, are set forth in Table 3.

TABLE 3

| $|e_{in}|$ Volts | $|e_{out}|$ Volts | ADC Result $e_{in}>0$ | ADC Result $e_{in}<0$ | Gain Code |
| --- | --- | --- | --- | --- |
| 6.1440E+000 | 5.8661E+000 | 11011100 | 00100100 | 0000 |
| 3.0720E+000 | 5.4895E+000 | 11010110 | 00101010 | 0001 |
| 1.5360E+000 | 5.1128E+000 | 11010000 | 00110000 | 0010 |
| 7.6800E−001 | 4.7362E+000 | 11001010 | 00110110 | 0011 |
| 3.8400E−001 | 4.3595E+000 | 11000100 | 00111100 | 0100 |
| 1.9200E−001 | 3.9892E+000 | 10111110 | 01000010 | 0101 |
| 9.6000E−002 | 3.6062E+000 | 10111000 | 01001000 | 0110 |
| 4.8000E−002 | 3.2296E+000 | 10110010 | 01001110 | 0111 |
| 2.4000E−002 | 2.8529E+000 | 10101100 | 01010100 | 1000 |
| 1.2000E−002 | 2.4762E+000 | 10100110 | 01011010 | 1001 |
| 6.0000E−003 | 2.0996E+000 | 10100001 | 01011111 | 1010 |
| 3.0000E−003 | 1.7229E+000 | 10011011 | 01100101 | 1011 |
| 1.5000E−003 | 1.3463E+000 | 10010101 | 01101011 | 1100 |
| 7.5000E−004 | 9.6962E−001 | 10001111 | 01110001 | 1101 |
| 3.7500E−004 | 5.9296E−001 | 10001001 | 01110111 | 1110 |
| 1.8750E−004 | 2.1631E−001 | 10000011 | 01111101 | 1111 | where the gain code is related to the actual gain by the equation

EQUATION 2

$$\text{Actual gain} = 2^{(gain\ code)}$$

with the gain code interpreted as an integer between 0 and 15, in base 10.

The preferred embodiment discussed above exhibits no underscaling, overscaling, or other problems associated with typical IFP amplifier gain control. The use of an eight-bit ADC 18 and a look-up table is only one method of interpreting the output of logarithmic amplifier 15. Other methods may be used which are well known to those skilled in the art.

Figure 5:
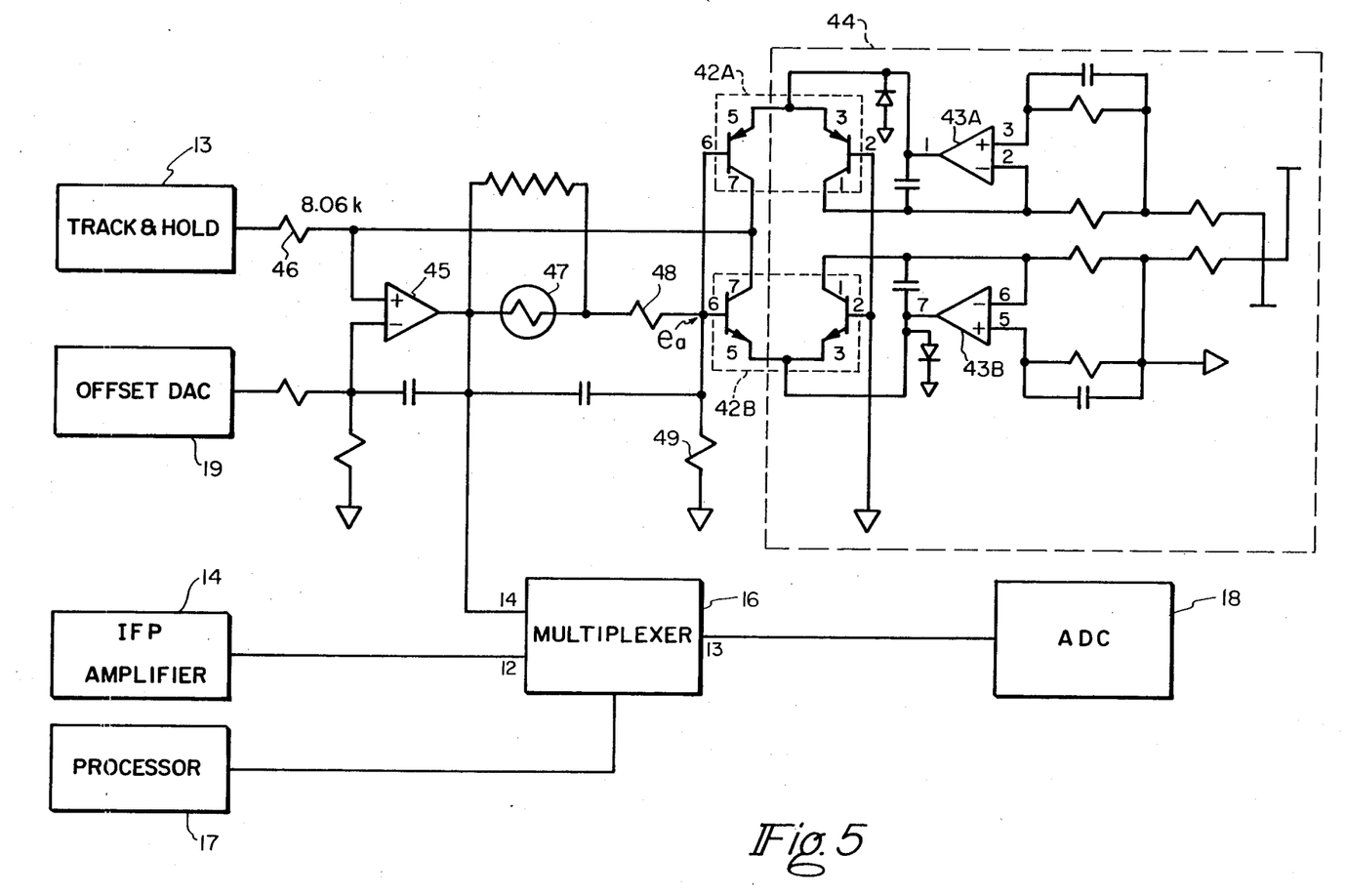
FIG. 5 is a schematic circuit diagram of the bipolar logarithmic amplifier used in the present invention.

FIG. 5 is a schematic circuit diagram of bipolar logarithmic amplifier 15. As depicted in FIG. 5, track and hold 13 sends the input sample signal to the logarithmic amplifier. Also, offset DAC 19 sends the appropriate offset correction voltage to the logarithmic amplifier. Subcircuit 44 is used to establish a reference current, $I_{ref}$.

These signals pass to two bipolar junction transistors 42A and 42B. Each of transistors 42A and 42B is specially designed so that there is a logarithmic relationship between its base-emitter voltage and its collector current. This logarithmic relationship is defined by the following equation:

EQUATION 3

$$V_{be} = (kT/q) \times \ln(I_c/I_s)$$

where
$V_{be}$ is the base to emitter voltage
k is Boltzmann's constant, equalling $1.38e^{-23}$
T is the temperature, in degrees Kelvin
q is the electronic charge, equalling $1.60e^{-19}$
$I_c$ is the collector current; and
$I_s$ is the device's leakage current.

If bipolar junction transistors 42A and 42B are well designed, the above equation holds true for at least 9 orders of magnitude of collector current.

Transistor 42A is used to calculate the log for negative input signals. Transistor 42B is used to calculate the log for positive input signals.

The circuit operation may be understood by considering transistor 42B.

Amplifier 43B establishes a fixed collector current, $I_{ref}$, of approximately 12.6nA on the right hand side (side A, corresponding to pins 1, 2, and 3) of transistor 42B.

Typical input sample signals range from ±8.192 volts. Any signal magnitude below approx. $8.192/2^{15}$ or 250 uV volts will be given the maximum IFP gain, so its log need not be found. The value of the reference current, $I_{ref}$, corresponds to the value of the smallest input signal of interest, i.e., 250 uV.

Amplifier 45 establishes the collector current of the left hand side (side B, corresponding to pins 5, 6, and 7) of transistor 42B. This current is given by the following equation:

EQUATION 4

$$I_c = e_{in}/R$$

where $I_c$ is the collector current
$e_{in}$ is the input voltage to both logarithmic amplifier 15 and to IFP amplifier 14
R is the value of resistor 46.

The base of side A of transistor 42B is grounded.

Since the two halves (sides A and B) of transistor 42B are well-matched, and since the device leakage current, $I_s$, is equal for both halves, the base voltage of side B of transistor 42B is given by the following equation:

EQUATION 5

$$e_a = V_{be}(\text{side B}) - V_{be}(\text{side A}) = (kT/q)ln(e_{in}/R)/I_{ref})$$

Negative temperature coefficient resistor 47, along with resistors 48 and 49, are used to compensate for changes in temperature and to amplify the signal, $e_a$. The resulting signal levels for various sample input levels are discussed above in connection Equation 1 and Table 3.

The output of logarithmic amplifier 15 is applied to pin 14 of multiplexer 16, and is subsequently sent via pin 13 to ADC 18 for conversion to an eight-bit binary word as discussed above.

What is claimed is:

1. An instantaneous floating point amplifier that amplifies an input sample signal, said amplifier comprising:
   a processor that outputs gain control signals;
   a logarithmic amplifier connected to said processor that determines which gain control signals will be outputted by said processor;
   at least one amplifier gain stage having a gain, wherein said stage includes:
   at least one operational amplifier;
   a plurality of resistors;
   a gain-setting multiplexer that, in response to said gain control signals, determines which of said resistors are connected to said operational amplifier to fix the gain of said operational amplifier.

2. An instantaneous floating point amplifier that amplifies a sample signal having a logarithmic relationship to its appropriate gain code, comprising:
   at least one amplifier stage having at least one gain setting;
   gain determining means for determining the appropriate gain code to be applied to said stage by using the logarithmic relationship between said sample signal and said appropriate gain code, and for outputting a log signal representative of said appropriate gain code; and
   means for applying said appropriate gain code to said amplifier stage.

3. The instantaneous floating point amplifier of claim 2 wherein said gain determining means includes:
   at least one bipolar junction transistor; and
   circuit means for producing a reference signal corresponding to the lowest sample signal of interest.

4. The instantaneous floating point amplifier of claim 3 wherein the base to emitter voltage of said bipolar junction transistor is defined by the following equation:
$$V_{be} = (kT/q) \times ln(I_c/I_s)$$

where $V_{be}$ is the transistor's base to emitter voltage
k is Boltzmann's constant, equalling $1.38e^{-23}$
T is the temperature, in degrees Kelvin
q is the electronic charge, equalling $1.60e^{-19}$
$I_c$ is the collector current; and
$I_s$ is the leakage current.

5. An instantaneous floating point amplifier that amplifies an input sample signal, comprising:
   at least one amplifier stage having at least one gain setting; has a
   means for outputting an analog signal that has a logarithmic relationship to said input sample signal;
   analog to digital converter means for converting said analog signal to a digital log signal;
   memory means for storing a table of stored digital values corresponding to gain control codes;
   means for comparing said digital log signal with said stored digital values to determine an appropriate gain code; and
   means for inputting said appropriate gain code to said amplifier stage.

6. The instantaneous floating point amplifier of claims 2 or 5, wherein said logarithmic relationship is defined by the following equation:

$$e_{out} = sgn(e_{in}) \times 0.5434 \times ln(7.941E^{03} \times |e_{in}|)$$

where $e_{out}$ is the output log signal
$e_{in}$ is the input sample signal
sgn ($e_{in}$) is the sign on the input sample signal $e_{in}$
$E^{03}$ refers einto $10^3 = 1000$
$|e_{in}|$ is the absolute value of the input sample signal $e_{in}$ 7. The instantaneous floating point amplifier of claim 2 or 5, wherein said gain control code that is used to determine the gain within said amplifier bears a one-to-one correspondence to an industry standard gain control code.

* * * * *

UNITED STATES PATENT AND TRADEMARK OFFICE
CERTIFICATE OF CORRECTION

PATENT NO. : 4,704,584

DATED : November 3, 1987

INVENTOR(S) : Miles A. Smither

It is certified that error appears in the above-identified patent and that said Letters Patent are hereby corrected as shown below:

A line is missing. It was added via the inventor's hand-written note on the original application. The following line should be inserted after "$sgn(e_{in})$ is the sign of the input signal $e_{in}$" found in col. 7, line 61

-- $E03$ refers to $10^3$ --

The word "orresponding" in col. 7, lines 65-66 should be deleted and replaced with -- corresponding --.

In claim 5, col. 10, line 31, the words "has a" should be deleted.

In claim 6, col. 10, line 53, the word "einto" should be replaced by -- to --.

Col. 7, line 43, the second "the" should be deleted.

Col. 9, line 30, the last parenthesis ")" in the equation is extraneous and should be deleted.

Signed and Sealed this

Twelfth Day of April, 1988

*Attest:*

DONALD J. QUIGG

*Attesting Officer*     *Commissioner of Patents and Trademarks*